LAMP TUNING INDICATOR FOR TRANSISTOR RADIO

Filed Dec. 20, 1963

INVENTORS
AKIO FUNAKI
KITATSU SATO
BY Paul M. Craig, Jr.
ATTORNEY

United States Patent Office 3,365,669

Patented Jan. 23, 1968

3,365,669
LAMP TUNING INDICATOR FOR TRANSISTOR RADIO

Akio Funaki and Kitatsu Sato, Yokohama-shi, Japan, assignors to Hitachi, Ltd., Tokyo, Japan, a corporation of Japan Filed Dec. 20, 1963, Ser. No. 332,205
Claims priority, application Japan, Dec. 22, 1962, 37/78,305
3 Claims. (Cl. 325—455)

ABSTRACT OF THE DISCLOSURE

A tuning indicator for transistor radio receivers is provided which includes intermediate frequency amplifier means for deriving an intermediate frequency signal from a received broadcast signal. A detector circuit is coupled to the output from the intermediate frequency amplifier for deriving a DC voltage of a magnitude corresponding to the signal strength of the intermediate frequency signal. A DC amplifying transistor having emitter, collector and base electrodes is provided with the emitter-base of the transistor being directly connected across the output of the detector. A low voltage electric lamp is connected in the output circuit of the DC amplifying transistor, and in preferred embodiments an on-off switch is connected along with the lamp in the output circuit of the DC amplifying transistor.

Figures 1, 2, 3:
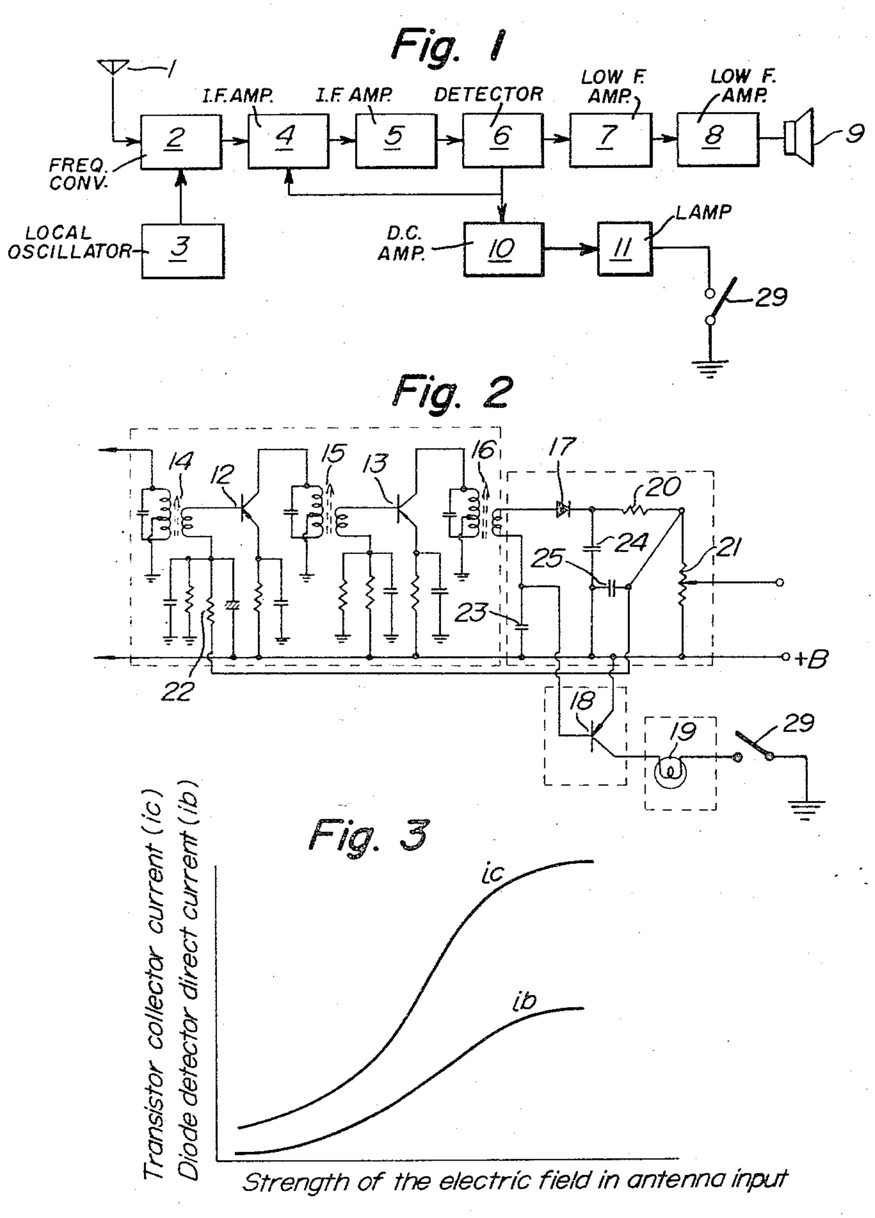

The present invention relates to a tuning indicator in a transistor radio receiver indicating whether the tuning frequency of the radio receiver and the frequency of a desired broadcast wave are in complete tune or not in the selection of the broadcast wave.

In order to have a radio receiver tuned with a desired broadcast wave, the selection of the tuning point has been generally performed by the amplitude of the sound from the speaker thereof. However, such method is sometimes difficult to select a tuning point due to the contents of broadcast. There is a method for indicating the tuned point by the sense of sight, which is surer and more accurate than by the sense of hearing, which employs a tuning indicator tube controlled by an automatic sound volume control voltage obtained from an intermediate frequency signal.

However, in a transistor radio receiver it is impossible to have such a tuning indicator tube operated because the voltage of the electric source employed with such receivers generally is too low to operate such a tube. Therefor, it would be necessary to have a high voltage generator for obtaining a sufficiently high voltage to be supplied to the plate of the tuning indicator tube. Also, most types of tuning indicator tubes are comparatively large and cannot be used in a miniature portable transistor radio. Additionally, the quantity of heat generated by such tuning indicator tubes is so large that it has a bad effect on the transistors of the receiver.

The object of the present invention is to obtain a tuning indicator, in which power consumption is very small, which is very compact in size and which can easily be employed in a transistor radio receiver that has a low voltage dry cell battery as its electric source.

According to the present invention, an intermediate frequency signal, which is obtained by having a received broadcast wave detected by a local oscillation frequency signal, is detected by a second detector and the intermediate frequency is separated into the components of high frequency, low frequency, and direct current. The direct current component is employed as the base bias current of a transistor amplifier for amplifying the tuning indicator signal. The collector current of the transistor amplifier thus controlled is supplied to a miniature lamp inserted in the circuit of the transistor collector for lighting the lamp and providing a tuning indicator signal in the form of a blink to thereby indicate the tuned point.

In the following description the present invention will be disclosed with reference to an embodiment illustrated by the accompanying drawings, and in which:

FIG. 1 shows the block diagram of the radio receiver according to the present invention, FIG. 2 the detailed circuits illustrating the construction of the intermediate amplifiers and detectors of a tuning indicator according to one embodiment of the present invention, and FIG. 3 the characteristic curves of the circuits shown in FIGURE 2.

In the diagram shown in FIG. 1, the high frequency signal induced in an antenna 1 by a broadcast wave, is transduced in frequency by a frequency transducer 2 and an oscillation frequency signal from a local oscillators 3. The signal becomes an intermediate frequency signal and is amplified to a signal of a required amplitude by intermediate frequency amplifiers 4, 5. This amplified, intermediate frequency signal, is detected by a detector 6, is separated into the components of high frequency, low frequency, and direct current, and the low frequency component thereof, is amplified by low frequency amplifiers 7, 8, and drives a speaker 9. On the other hand, the direct current component obtained by the detector 6, is recycled into the intermediate frequency amplifier 4, controls the gain of the intermediate frequency amplifier 4 so as to have the output of the speaker constant regardless of the strength of the electric field of the received signal at the antenna input. A part of the direct current component also is supplied to a direct current amplifier 10, the output of which, as the working current is increased or decreased, indicates the tuned point with a tuning indicator lamp 11 that is blinked.

Now, describing the present invention in further detail with reference to the circuit embodiments illustrated in FIG. 2, in the diagram numerals 12, 13 indicate intermediate frequency amplifier transistors, numerals 14, 15, 16 intermediate frequency transformer coupling stages, numeral 17 a detector diode, numeral 18 a direct current amplifier transistor, numeral 19 a tuning indicator miniature lamp, 20, 21, 22 resistors, and 23, 24, 25 condensers, respectively.

As illustrated in the diagram, the anode of the diode 17 is connected to one end of the secondary winding of the intermediate frequency coupling transformer 16. The cathode of diode 17 is connected to the +B terminal of the electric source through the resistors 20, 21. Further, the junction point of the cathode of diode 17 and the resistor 20 is connected to the electric source circuit through the condenser 24. The junction point of the resistors 20, 21 is connected to one end of the secondary winding of the intermediate frequency coupling transformer 14 through the resistor 22, and is further connected to the +B terminal of the electric source through the condenser 25. The end of the secondary winding of the intermediate coupling transformer 16 remote from diode 17 is connected to the +B terminal of the electric source through the condenser 23. Further, the junction point of said remote end of the secondary winding of the intermediate frequency coupling transformer 16 and the condenser 23 is connected to the base electrode of the direct current amplifier transistor 18. The emitter electrode of the transistor 18 is connected to the +B terminal of the electric source and the collector electrode is grounded through the tuning indicator miniature lamp 19. The sliding terminal of the variable resistor 21 is connected to the input of a low frequency amplifier in a conventional manner for supplying output audio signals. Since the construction of the high frequency amplifiers is conventional in nature and is broadly known, the description thereof will be omitted here.

The operation of the present invention as described above is as follows. When the antenna circuit of the frequency transducer 2 is tuned to receive a broadcast wave, the high frequency signal induced by said broadcast wave is converted into an intermediate frequency signal that is amplified by the transistor amplifiers 12, 13, and supplies to the secondary winding of the intermediate frequency coupling transformer 16. This intermediate frequency signal is detected by the diode 17, the high frequency component thereof flows through the condensers 24, 23 and hence, in effect, is by-passed to ground. The low frequency component thereof flows through diode 17, the resistor 20, the variable resistor 21, and the condenser 23, in the order named, and reaches the other end of the secondary winding of the intermediate frequency transducer 16. The direct current component flows through the resistor 20, the variable resistor 21, the emitter electrode of the transistor 18, and the base electrode, in the order named, and reaches the other end of the secondary winding of the intermediate frequency transducer 16. A desired magnitude, low frequency component flowing through the variable resistor 21 is taken out of the sliding terminal and is supplied to a low frequency amplifier in the output stages of the receiver. Concurrently, a voltage is developed across the variable resistor 21 by the direct current component such that the side connected to the +B terminal of the electric source will become negative, and the side of the terminal connected with the resistor 20 positive. The voltage, which is positive relative to the +B terminal of the electric source circuit, is impressed on the base electrode of the transistor 12 through the resistor 22. Hence, the gain of the base electrode is controlled to thereby control automatically the gain of the receiver. On the other hand, the direct current component flowing through the emitter electrode of the transistor 18 to the base electrode becomes the base bias current of the transistor 18, and controls the collector current of the transistor 18. This controlled collector current flows through the tuning indicator miniature lamp 19, and controls the point where the miniature lamp is lighted and thereby indicates the tuned point.

The direct current component obtained by the detecting action of the detector diode 17 increases, as shown by a curve *ib* in FIG. 3, with the increase in the strength of the electric field in the antenna input. As a consequence, the collector current in the direct current amplifier transistor 18 also increases as shown by a curve *ic*.

In operation, when tuning the receiver to a broadcast wave by varying the tuning frequency of the antenna circuit, a detector direct current component is obtained which corresponds to the strength of the signal of broadcast wave. As a consequence the transistor 18 increases its collector current by said direct current so that the tuning indicator miniature lamp is turned on. When the tuned frequency of antenna circuit is deviated from the broadcast wave, the strength of the antenna input signal gets smaller. The direct current component in the detector output becomes smaller, and the collector current of the transistor 18 is decreased. Hence, the brightness of the tuning indicator miniature lamp 19 is decreased, and thereby indicates that the tuning is out.

Further, according to the present invention, power consumption may be reduced by having a switch 29 provided in the circuit between the tuning indicator miniature lamp and the ground so arranged as to have the miniature lamp blinked by closing the switch only when broadcast wave is being received.

According to the present invention as described hereinabove a transistor receiver having a tuning indicator, which operates under a low voltage, which is very compact in size, and small in power consumption, is obtained.

What is claimed is:

1. A tuning indicator for transistor radio receivers including in combination intermediate frequency amplifier means for deriving an intermediate frequency signal from a received broadcast signal, a detector coupled to the output from said intermediate frequency amplifier means for deriving a DC voltage of a magnitude corresponding to the signal strength of said intermediate frequency signal, a separate DC amplifying transistor having emitter, collector and base electrodes which is independent of prior stages of the receiver, the emitter-base of said DC amplifying transistor being directly connected across the output of said detector for supplying said DC voltage from said detector to said DC amplifying transistor so as to control the gain thereof, and a low voltage electric lamp connected in the output circuit of said DC amplifying transistor and lighted by the output current thereof, the polarity of connection of the transistor emitter-base being such that the electric lamp is lighted only upon the receiver being tuned to a received signal.

2. A tuning indicator for transistor radio receivers according to claim 1 further comprising an on-off switch connected in the output circuit of the DC amplifying transistor along with the lamp.

3. A tuning indicator for transistor radio receivers according to claim 2 wherein the detector comprises the second detector of the transistor radio receiver.

References Cited

UNITED STATES PATENTS

| | | | |
|---|---|---|---|
| 2,159,240 | 5/1939 | Wheeler | 325—455 |
| 2,836,713 | 5/1958 | Scott et al. | 325—455 X |
| 3,116,372 | 12/1963 | Wolff | 325—455 X |
| 3,249,872 | 5/1966 | Krammer | 325—455 X |

FOREIGN PATENTS

| | | |
|---|---|---|
| 438,255 | 11/1935 | Great Britain. |

KATHLEEN H. CLAFFY, *Primary Examiner.*

R. LINN, *Assistant Examiner.*